(12) United States Patent
Contopanagos et al.

(10) Patent No.: US 6,944,435 B2
(45) Date of Patent: Sep. 13, 2005

(54) UNCONDITIONALLY STABLE ON-CHIP FILTER AND APPLICATIONS THEREOF

(75) Inventors: Harry Contopanagos, Santa Monica, CA (US); Chryssoula Kyriazidou, Santa Monica, CA (US); Jacob Rael, Los Angeles, CA (US); Ahmadreza Rofougaran, Marina Del Ray, CA (US)

(73) Assignee: Broadcom, Corp., Irvine, CA (US)

( * ) Notice: Subject to any disclaimer, the term of this patent is extended or adjusted under 35 U.S.C. 154(b) by 443 days.

(21) Appl. No.: 10/160,915

(22) Filed: Jun. 3, 2002

(65) Prior Publication Data
US 2003/0224746 A1 Dec. 4, 2003

(51) Int. Cl.[7] .............................................. H04B 1/10
(52) U.S. Cl. .................. 455/307; 455/339; 333/167
(58) Field of Search ......................... 455/73, 130, 296, 455/307, 333, 334, 339, 522.1; 333/167, 172, 213, 217

(56) References Cited

U.S. PATENT DOCUMENTS

| | | | | |
|---|---|---|---|---|
| 5,451,915 A | * | 9/1995 | Katzin et al. | 333/213 |
| 5,550,520 A | * | 8/1996 | Kobayashi | 333/213 |
| 6,307,442 B1 | * | 10/2001 | Meyer et al. | 333/217 |
| 6,728,517 B2 | * | 4/2004 | Sugar et al. | 455/73 |

* cited by examiner

*Primary Examiner*—Quochien B. Vuong
(74) *Attorney, Agent, or Firm*—Garlick, Harrison & Markison, LLP

(57) ABSTRACT

An unconditionally stable on-chip filter includes a filtering section and at least one negative resistance module. The filtering section is operably coupled to filter a signal and includes realizable integrated circuit passive components. The at least one negative resistance module is operably coupled to compensate for integrated circuit losses of the filtering section. The realizable integrated circuit passive components have values that are robust, in comparison to parasitic values, have minimal integrated circuit real estate, and provide realizable values for various integrated circuit manufacturing processes including CMOS technology.

40 Claims, 7 Drawing Sheets

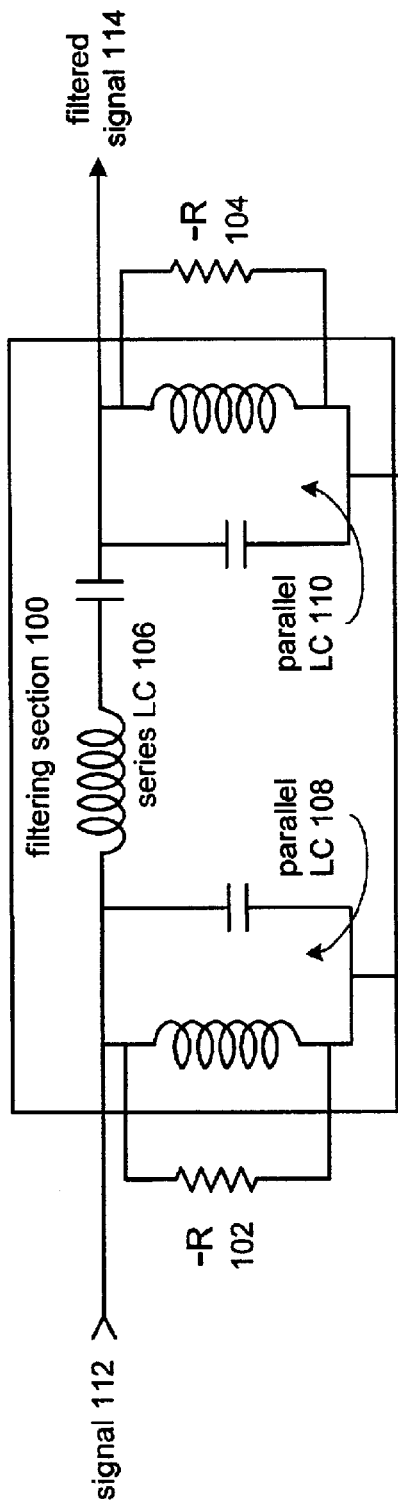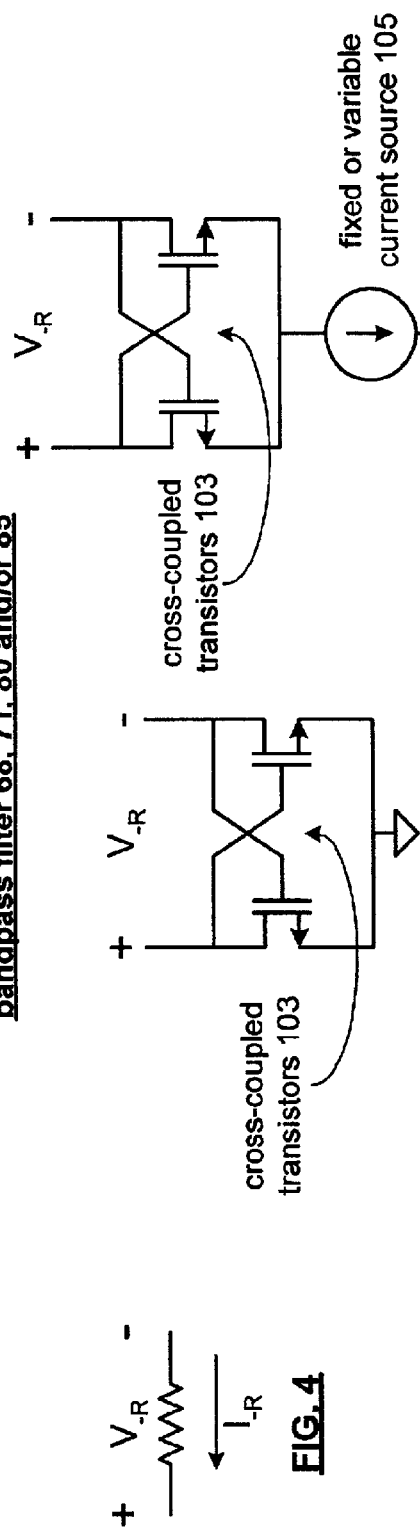

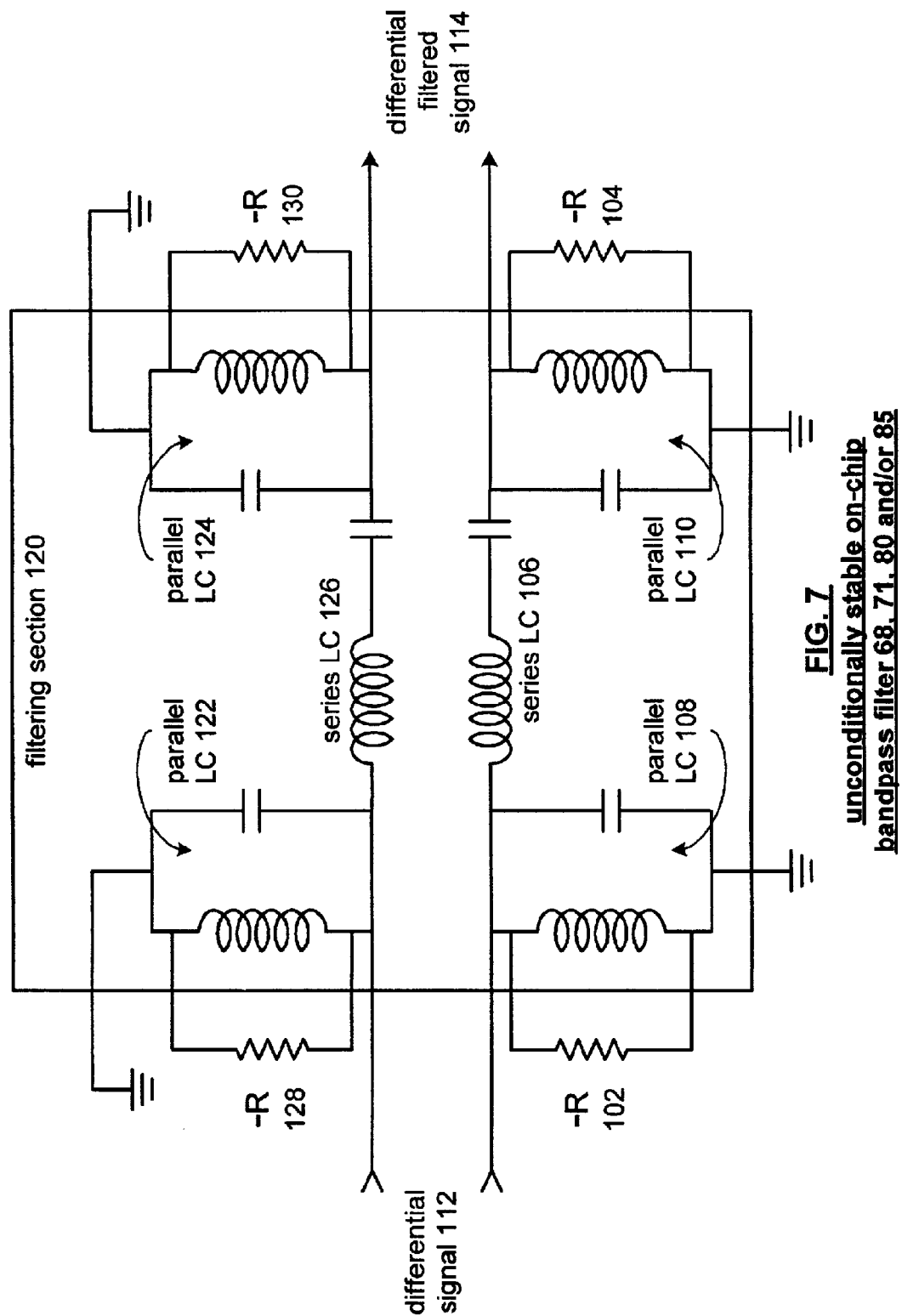
FIG. 7 unconditionally stable on-chip bandpass filter 68, 71, 80 and/or 85 unconditionally stable on-chip low pass filter 68 and/or 80 unconditionally stable on-chip low pass filter 68 and/or 80 unconditionally stable on-chip high pass filter 170 unconditionally stable on-chip high pass filter 190

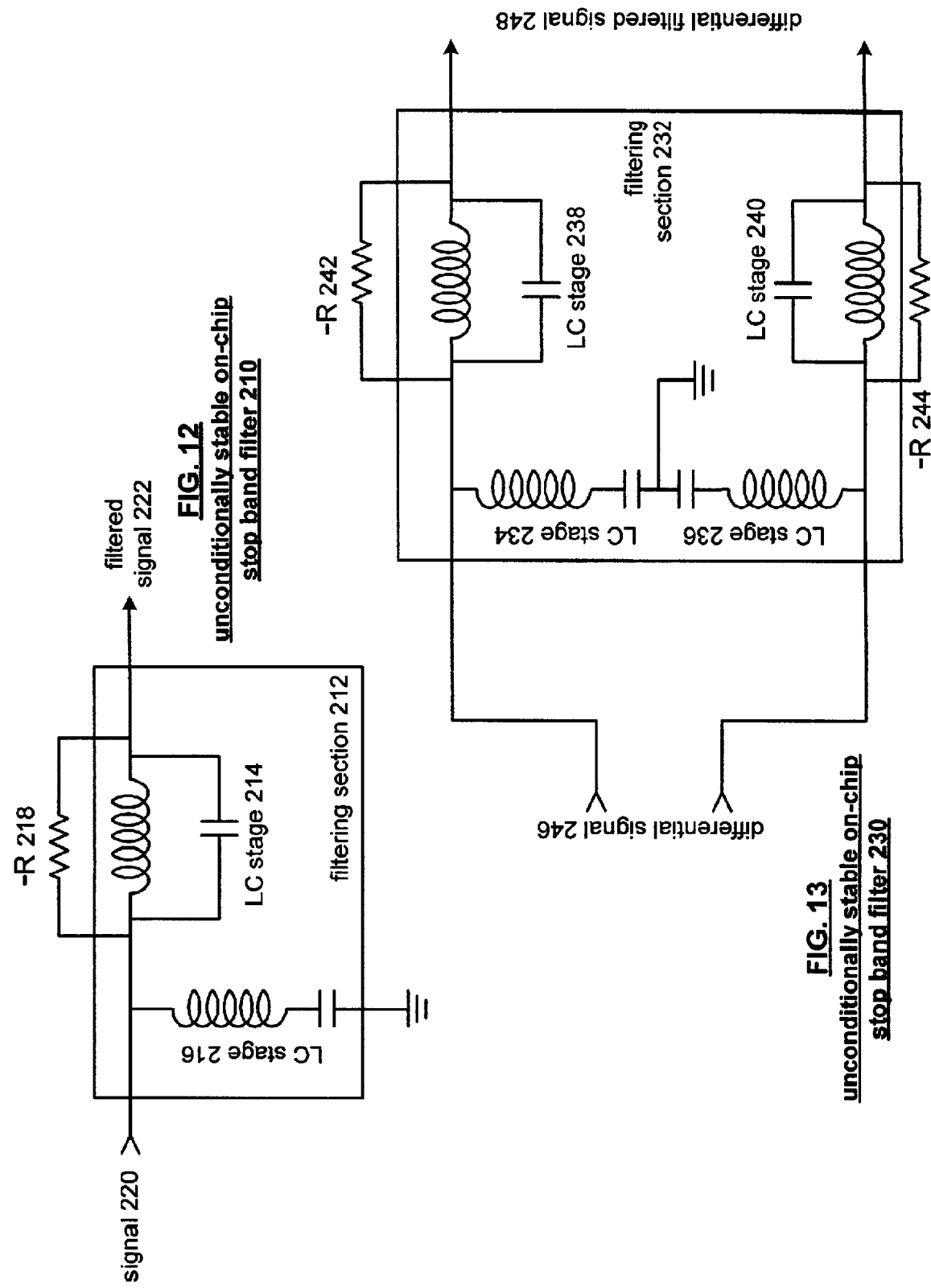

UNCONDITIONALLY STABLE ON-CHIP FILTER AND APPLICATIONS THEREOF

TECHNICAL FIELD OF THE INVENTION

This invention relates generally to data communication and more particularly to filtering of data for such communications.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

In both the receiver and transmitter sections of a wireless communication device, bandpass filtering and low pass filtering are critical for proper operation. In radio frequency integrated circuits, such filtering is typically achieved using a standard lumped element filter design, which has at least three primary issues, especially for CMOS technology. In particular, the three issues include passive design synthesis, passive design loss, and stability. The passive design synthesis issue becomes significant when a passive filter is designed for narrow band operation in the gigahertz range. For instance, a standard Chebychev design produces a minimal 2 pole bandpass filter, which has large series inductors (e.g., 50–60 nano Henries) and very small shunt inductors (0.1–0.2 nano Henries). For integrated circuit design, the series inductors, if they are to have a substantial Q factor, are very large, i.e., consume a significant amount of integrated circuit real estate, while the shunt inductors are very small. As is known, very small inductance values are sensitive to process variations, which can provide percentage variations of the inductance value in the order of 100% or more, which completely destroys the desired filtering properties.

In addition, the Chebychev design procedure results in a similar problem for capacitors. In particular, the series capacitors are very small (e.g., 0.5–0.1 pico Farads) and can be completely over shadowed by the parasitic capacitance of the inductors, adjacent signal lines, et cetera making the filter not operate as desired. Conversely, the shunt capacitance is very large (e.g., 40 pico Farads) and occupies a significant amount of integrated circuit real estate. As such, the standard design procedure yields unacceptable filters for integrated circuits including radio frequency integrated circuits.

Passive design loss results from energy losses due to the metal and substrate of at least some of the elements in a filter. In some instances, the loss may be as much as 20 dB. To remedy the passive loss, active elements should be introduced into the passive filter design. As with any filter, if the filter includes an active element it must be created in such a way to be unconditionally stable. As is known, if a filter becomes unstable, it acts as an oscillator injecting unwanted oscillations into the system.

Therefore, a need exists for on-chip filters that include realizable passive components, have reduced passive losses, and are unconditionally stable.

SUMMARY OF THE INVENTION

The unconditionally stable on-chip filter disclosed herein substantially meets these needs and others. An unconditionally stable on-chip filter includes a filtering section and at least one negative resistance module. The filtering section is operably coupled to filter a signal and includes realizable integrated circuit passive components. The at least one negative resistance module is operably coupled to compensate for integrated circuit losses of the filtering section. In general, the realizable integrated circuit passive components have values that are robust, in comparison to parasitic values, have minimal integrated circuit real estate, and provide realizable values for various integrated circuit manufacturing processes including CMOS technology.

The losses introduced by the realizable integrated circuit passive components are compensated for by the at least one negative resistance module. In one embodiment, the at least one negative resistance is implemented utilizing cross-coupled field effect transistors (FETs). To ensure that the filter is unconditionally stable, with the addition of active components (e.g., the FETs), the gate source capacitance, transconductance of the active components, and roll-off frequency of the FETs are determined in combination with at least one passive component of the filtering section to ensure unconditional stability.

The filtering section may be implemented as a bandpass filter, low pass filter, high pass filter or a stop band filter. An unconditionally stable on-chip bandpass filter and low pass filter may be readily utilized in the receiver section and/or the transmitter section of radio frequency integrated circuits. As such, the unconditionally stable on-chip filter of the present invention provides an on-chip filter that includes realizable passive components, has reduced passive losses, and is unconditionally stable.

BRIEF DESCRIPTION OF THE DRAWINGS

FIG. 3 illustrates a schematic block diagram of an unconditionally stable on-chip single-ended bandpass filter in accordance with the present invention;

FIG. 4 illustrates a symbolic representation of a negative resistance module in accordance with the present invention;

FIG. 5 illustrates a schematic block diagram of an embodiment of a negative resistance module in accordance with the present invention;

FIG. 6 illustrates an alternate embodiment of a negative resistance module in accordance with the present invention;

FIG. 7 illustrates a schematic block diagram of an unconditionally stable on-chip differential bandpass filter in accordance with the present invention;

FIG. 12 illustrates a schematic block diagram of an unconditionally stable on-chip single ended stop band filter in accordance with the present invention; and FIG. 13 illustrates a schematic block diagram of an unconditionally stable on-chip differential stop band filter in accordance with the present invention.

DETAIL DESCRIPTION OF A PREFERRED EMBODIMENT

Figure 1:
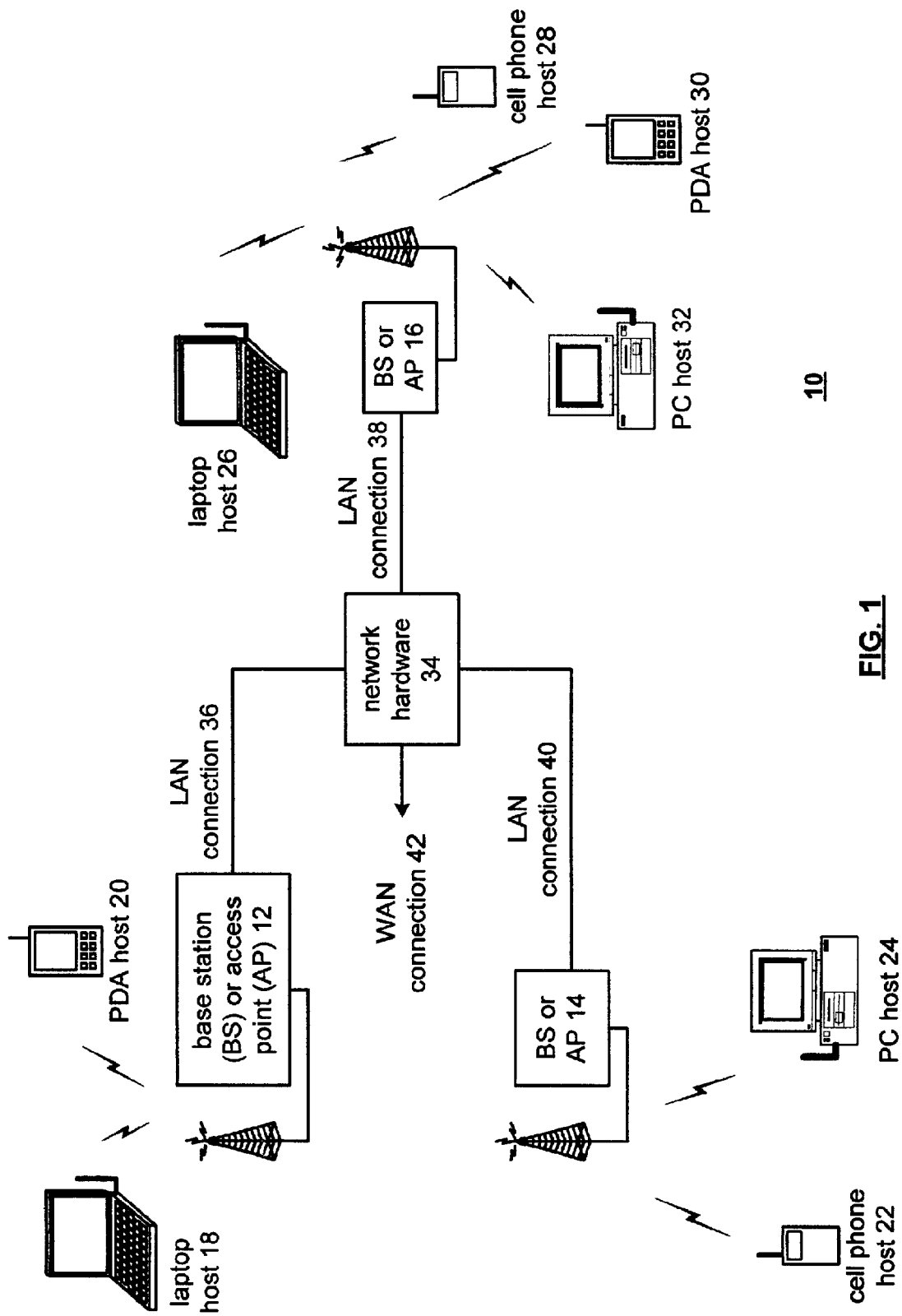
FIG. 1 illustrates a schematic block diagram of a wireless communication system in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes on-chip filtering as disclosed herein to enhance performance of radio frequency integrated circuits.

Figure 2:
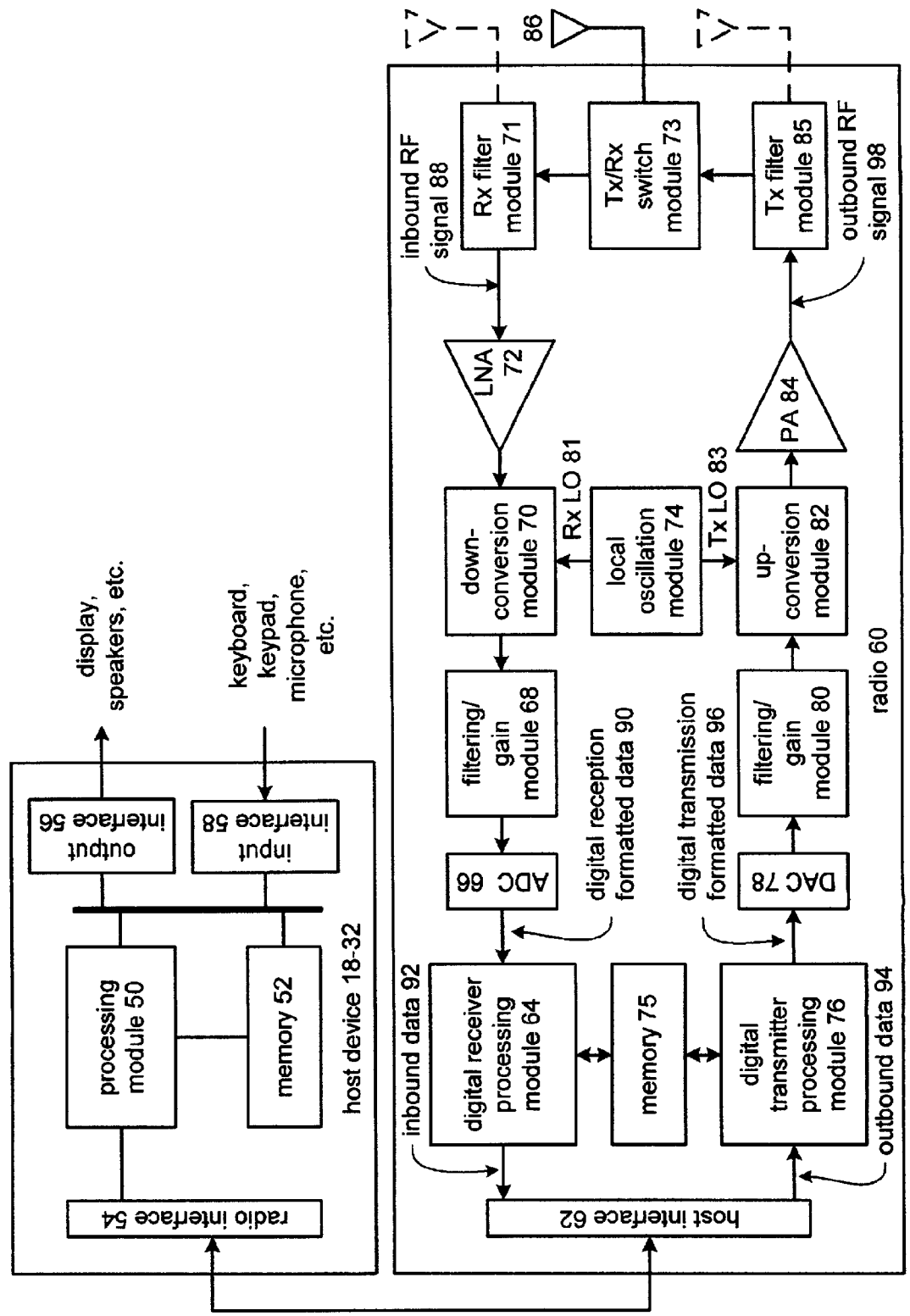
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides outbound data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, an antenna switch 73, and an antenna 86. The receiver section includes a digital receiver processing module 64, analog-to-digital converter 66, filtering/gain module 68, down conversion module 70, receiver filter module 71, low noise amplifier 72, and at least a portion of memory 75. The transmitter section includes a -digital transmitter processing module 76, digital-to-analog converter 78, filtering/gain module 80, up-conversion module 82, power amplifier 84, transmitter filter module 85, and at least a portion of memory 75. The antenna 86 may be a single antenna that is shared by the transmit and receive paths via the antenna switch 73 or may include separate antennas for the transmit path and receive path and omit the antenna switch. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80, which may be implemented in accordance with the teachings of the present invention, filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98, which are filtered by the transmitter filter module 85, which may be implemented in accordance with the teachings of the present invention. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device and filters the signals 88 via the receiver filter module 71, which may be implemented in accordance with the teachings of the present invention. The receiver filter module 71 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which may be implemented in accordance with the teachings of the present invention, to filter and/or adjust the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the radio may be implemented a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18–32. Regardless of how the radio is implemented, the concepts of the present invention are applicable.

FIG. 3 illustrates a schematic block diagram of an unconditionally stable on-chip single ended bandpass filter, which may be used in the receiver filter module 71, filtering/gain module 68 of the receiver path of radio 60 of FIG. 2 and/or in the filtering/gain module 80 and/or transmitter filter module 85 of the transmitter section of radio 60. The unconditionally stable on-chip bandpass filter includes a filtering section 100, a $1^{st}$ negative resistance module 102, and a $2^{nd}$ negative resistance module 104. The filtering section 100 includes a series inductor capacitor (LC) circuit 106 and two parallel LC circuits 108 and 110. The shunt inductors of the parallel LC circuits 108 and 110 are designed to have an inductance that is readily reproducible in integrated circuit technologies, including CMOS. For example, the inductance of the shunt inductors in the parallel LC circuits 108 and 110 may be in the range of 1 nano Henries to several nano Henries for a filter operating range in the gigahertz range. The inductor of the series LC circuit 106 has an inductance value that is significantly smaller than the standard design approach. For instance, the series inductance for a multi-gigahertz bandpass filter, may be in the range of 20–30 nano Henries for a filter operating in the gigahertz range.

The series capacitance of the series LC circuit 106 is increased in size, with respect to the standard design procedure, to be significantly larger than the parasitic capacitance of the series inductor. In addition, the shunt capacitors in the parallel LC circuits 108 and 110 are reduced in size thereby reducing the integrated circuit real estate needed to implement them. For example, in a multi-gigahertz bandpass filter, each of the capacitors may a capacitance value of approximately 4 picoFarads.

As illustrated, the filtering section 100 receives a signal 112, which may correspond to the RF signal 88 received via antenna 86, the outbound RF signal 98 prior to transmission, the baseband signal produced by down conversion module 70 and/or the analog representation of the digital transmission formatted data 96. Regardless of which signal is being represented by signal 112, the filtering section 100 performs a bandpass filtering function upon the signal to produce the filtered signal 114.

Within the filtering section 100, the passive components producing a majority of the losses are the shunt inductors within the parallel LC circuits 108 and 110. To compensate for these losses, the negative resistance module 102 is coupled in parallel with the inductor of parallel LC circuit 108 and the negative resistance module 104 is coupled in parallel with the inductor of the parallel LC circuit 110. The losses of the series LC circuit 108 are insignificant in comparison to the losses introduced by the parallel LC circuits 108 and 110. Accordingly, the minimal losses of the LC circuit 106 do not require compensation.

The unconditionally stable on-chip bandpass filter of FIG. 3 may be tunable by including a varactor coupled in parallel and/or in series with one or more of the capacitors of the series LC circuit 106 and of the parallel LC circuits 108 and 110. As one of average skill in the art will appreciate, more stages of bandpass filtering may be included to provide sharper frequency roll-offs. If additional stages are added, negative resistance modules should be connected in parallel with the shunt inductors of the parallel LC circuits of each additional stage.

FIG. 4 illustrates a symbolic representation of the negative resistance. As shown, the negative resistance is illustrated as a resistor that has a voltage ($V_R$). The voltage $V_R$ has a polarity indicated via the plus and minus signs. For a normal resistor, current flows through the resistor from the more positive voltage to the more negative voltage. In a negative resistance circuit, the current flows from the more negative voltage to the more positive voltage. The current is designated as $I_R$.

FIG. 5 illustrates one embodiment of a negative resistance module 102 or 104. In this embodiment, the negative resistance module includes cross-coupled transistors 103. In this illustration, the gate of one transistor is coupled to the drain of the other transistor, where each transistor is an N-channel FET. As such, when the voltage $V_R$ has a polarity as shown, the transistor having its drain coupled to the negative side of the voltage is turned on such that current is flowing from the negative terminal towards the reference potential. Thus, a negative current is created with respect to the voltage imposed across the device.

FIG. 6 illustrates an alternate embodiment of a negative resistance module 102 or 104. In this embodiment, the negative resistance module includes the cross-coupled transistors 103 and a fixed or variable current source 105. The fixed or variable current source is used to more finely tune the negative resistance value. In the embodiments of the negative resistance modules illustrated in FIGS. 5 and 6, the FETs are designed to have a transconductance which, when taken into consideration with the losses of the shunt inductor, produce an unconditionally stable response.

FIG. 7 illustrates a schematic block diagram of an unconditionally stable on-chip differential bandpass filter that may be used within the filtering/gain module 68, the receiver filter module 71, the filtering/gain module 80 and/or the transmitter filter module 85. The unconditionally stable on-chip differential bandpass filter includes the single ended bandpass filter of FIG. 3, in particular the series LC circuit 106, the parallel LC circuits 108 and 110 and negative resistance modules 102 and 104. The differential bandpass filter also includes a mirrored image circuit that includes series LC circuit 126, parallel LC circuits 122 and 124 and negative resistance modules 128 and 130. The differential bandpass filter is operably coupled to receive differential signals 112, which may correspond to inputs of the filtering modules 68 or 80 and the high frequency filtering module 71 or 85. The filtering section 120 filters the differential signals 112 to produce differential filtered signals 114.

In this embodiment, the bandpass filter is implemented utilizing inductors and capacitors that are realizable in various integrated circuit technologies including CMOS technology. For example, in a multi-gigahertz bandpass filter, the shunt inductors of the parallel LC circuits 108, 110, 122 and 124 may be 1 nano Henry to several nano Henries. The series inductance in the series LC circuits 106 and 126 may be in the 20–30 nano Henries range. The capacitors in each of the parallel LC circuits and series LC circuits may be of the same capacitance value of approximately 4 pico-Farads. Note that the quality factor of the shunt inductors may be adjusted by increasing the size of the inductors and, as the quality factor increases, the bandpass region has a flatter frequency response.

As one of average skill in the art will appreciate, one or more of the capacitors in the filtering section may have a varactor coupled in parallel or in series with it to produce a variable capacitance such that the frequency response of the bandpass filter may be tuned.

As an alternate embodiment to having individual negative resistances coupled across the shunt inductors, negative resistances 128 and 102 may be combined into a single negative resistance coupled across the differential input. Similarly, negative resistances 104 and 130 may be replaced by a single negative resistance coupled across the differential output of the filter section 120. In this alternate embodiment, the design of the negative resistance module is done with relation to the parallel response of the corresponding shunt inductors of parallel LC circuits 108 and 122 and of parallel LC circuits 110 and 124. Accordingly, the transconductance and parasitic capacitances of the cross-coupled FETs used to implement the negative resistance module are selected to produce an unconditionally stable response in combination with the paralleled combination of the shunt inductors.

Figure 8:
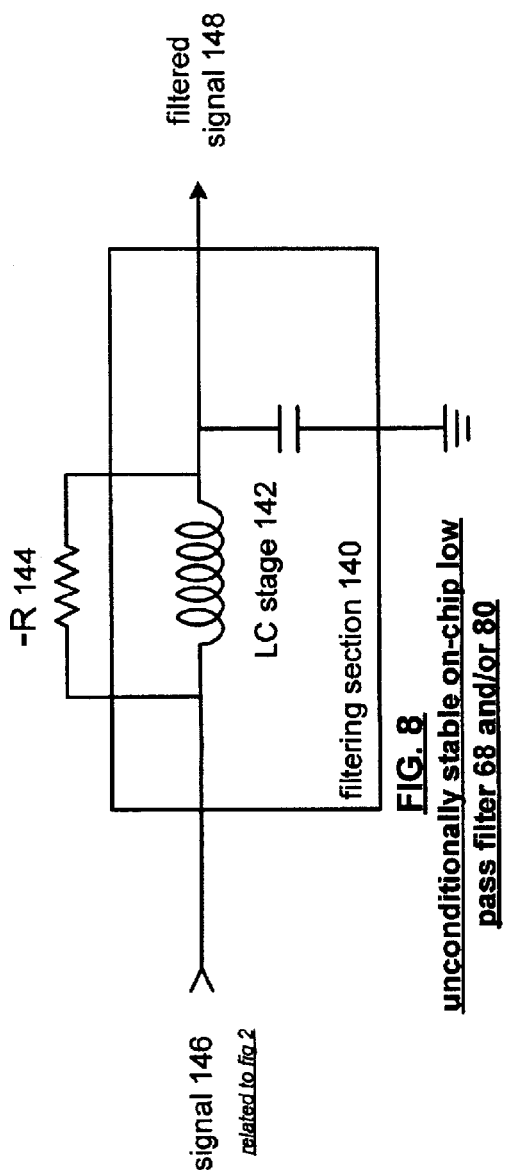
FIG. 8 illustrates a schematic block diagram of an unconditionally stable on-chip single ended low pass filter in accordance with the present invention.

FIG. 8 illustrates a schematic block diagram of an unconditionally stable on-chip low pass filter, which may be utilized in the receiver filtering module 68 or the transmitter filtering module 80. The unconditionally stable on-chip low pass filter includes a filtering section 140 and a negative resistance module 144 to produce a filtered signal 148 from an input signal 146. The filtering section 140 includes an LC stage 142. The negative resistance 144 is operably coupled in parallel with the inductor of the LC stage 142 and may be implemented as shown in FIGS. 5 and 6. The inductor and capacitor of the LC stage 142 are of a size, both in value and in IC real estate, that are realizable integrated circuit passive components.

As one of average skill in the art will appreciate, multiple LC stages may be included in the filtering section to provide a steeper roll-off for the filtering response. In addition, one of average skill in the art will appreciate that a varactor may be coupled in parallel and/or series with the capacitor of the LC stage 142 to produce a variable capacitor value. Accordingly, when the capacitance value is varied, the frequency response of the low pass filter may be adjusted.

Figure 9:
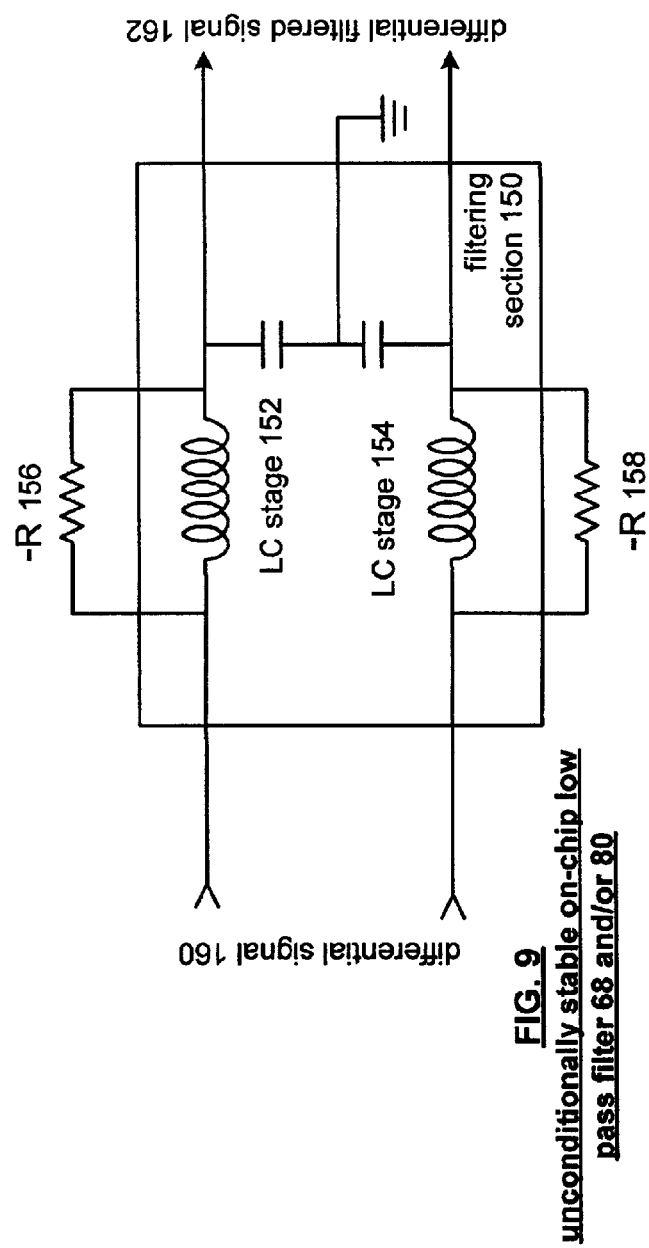
FIG. 9 illustrates a schematic block diagram of an unconditionally stable on-chip differential low pass filter in accordance with the present invention.

FIG. 9 illustrates a schematic block diagram of an unconditionally stable on-chip differential low pass filter, which may be used in the filtering module 68 of the receiver section and/or filtering module 80 of the transmitter section of radio 60 of FIG. 2. In this illustration, the filtering section 150 includes the LC stage 152 and LC stage 154 coupled as shown. Negative resistance module 156 is operably coupled in parallel to the inductor of LC stage 152 and negative resistance module 158 is operably coupled to the inductor of LC stage 154. The filtering section 150 receives a differential signal 160 that produces a differential filtered signal 162.

The negative resistance modules 156 and 158 may be implemented in accordance with the embodiments illustrated in FIG. 5 or 6. The capacitors and inductors of LC stages 152 and 154 are fabricated to be realizable integrated circuit passive components. As such, their values and geometric size are such that they are relatively insensitive to process variations and do not consume too much IC real estate.

Figure 10:
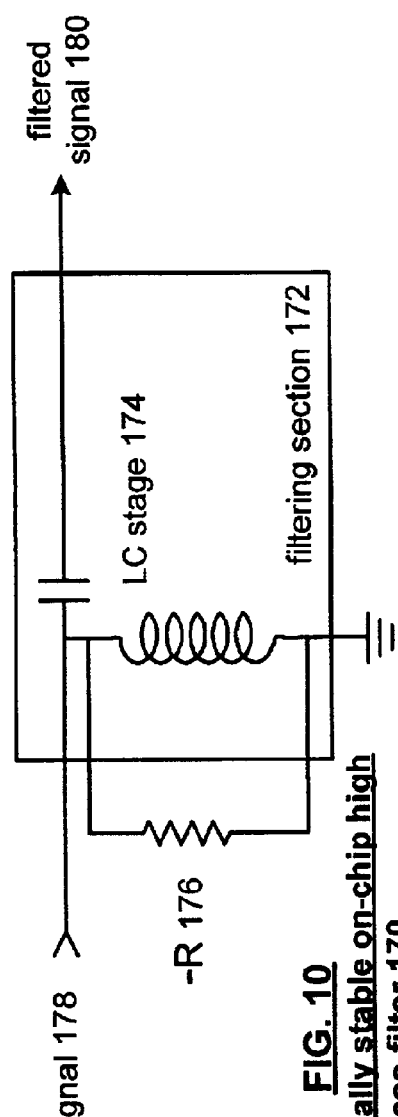
FIG. 10 illustrates a schematic block diagram of an unconditionally stable on-chip single ended high pass filter in accordance with the present invention.

FIG. 10 illustrates an unconditionally stable on-chip single ended high pass filter 170. The high pass filter 170 includes a filtering section 172 and a negative resistance module 176. The filtering section 172 includes an LC stage 174. In operation, the filtering section 172 receives an input signal 178 and high pass filters it to produce filtered signal 180.

The negative resistance module 176, which may be implemented as illustrated in FIG. 5 or 6, compensates for the losses of the inductor of the LC stage 174. As one of average skill in the art will appreciate, additional LC stages may be included within filtering section 172 to provide a steeper frequency response. In addition, as one of average skill in the art will appreciate, a varactor may be coupled in parallel and/or in series with the capacitor of the LC stage 174 to provide tunability to the high pass filter 170.

Figure 11:
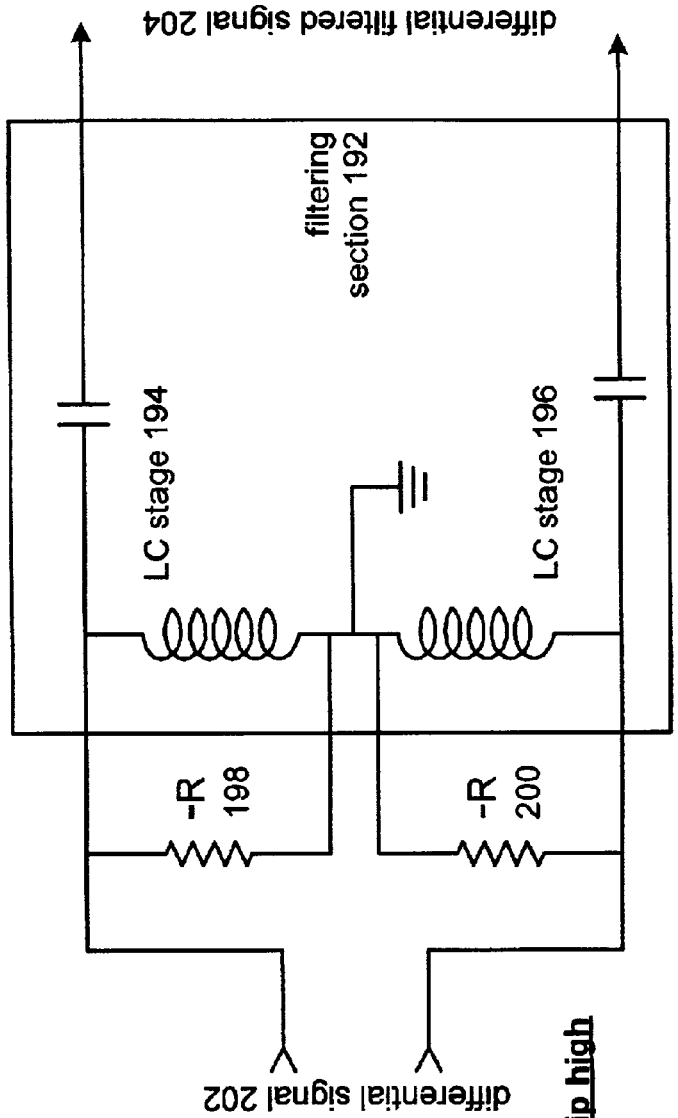
FIG. 11 illustrates a schematic block diagram of an unconditionally stable on-chip differential high pass filter in accordance with the present invention.

FIG. 11 illustrates an unconditionally stable on-chip differential high pass filter 190. In this embodiment, the high pass filter 190 includes a filtering section 192 and negative resistance modules 198 and 200. The filtering section 192 includes two LC stages, 194 and 196. The filtering section 192 is operably coupled to high pass filter a differential signal 202 to produce a differential filtered signal 204.

The negative resistance modules 188 and 200, which may be implemented as described with reference to FIG. 5 or 6, compensates for losses of the inductors within the LC stages 194 and 196. As one of average skill in the art will appreciate, the inductor values and capacitor values are sized to be realizable integrated circuit passive components. As one of average skill in the art will further appreciate, the filtering section 192 may include additional LC stages to adjust the frequency response of the high pass filter 190. In addition, one of average skill in the art will appreciate that the one or more of the capacitors in LC stages 194 or 196 may include a veractor coupled in series and/or in parallel to tune the filter response of high pass filter 190.

FIG. 12 illustrates a schematic block diagram of an unconditionally stable on-chip stop band filter 210. The stop band filter 210 includes a filtering section 212 and a negative resistance module 218. The filtering section 212 includes a series LC stage 216 and a parallel LC stage 214. The negative resistance module 218, which may be implemented in accordance with the embodiments of FIG. 5 or 6, is coupled in parallel with the inductor of the parallel LC stage 214.

The filtering section 212 is operably coupled to receive a signal 220 and to stop band filter it to produce a filtered signal 222. The inductors and capacitors of LC stages 214 and 216 are designed to be realizable integrated circuit passive components. As one of average skill in the art will appreciate, the filtering section 212 may include additional LC stages to add to the frequency response of the stop band filter 210. In addition, one of average skill in the art will appreciate, that one or more of the capacitors in the filtering section may have a varactor coupled in parallel and/or in series to provide tunability to the stop band filter 210.

FIG. 13 illustrates a schematic block diagram of an unconditionally stable on-chip differential stop band filter 230. In this embodiment, the stop band filter 230 includes a filtering section 232, and two negative resistance modules 242 and 244. The filtering section 232 includes four LC stages 234-240 coupled as illustrated. The negative resistance modules 242 and 244, which may be implemented in accordance with the embodiments of FIGS. 5 and 6, are coupled in parallel with the inductors of LC stages 238 and 240, respectively.

The filtering section 232 is operably coupled to filter a differential signal 246 and produce a differential filtered signal 248. As one of average skill in the art will appreciate, additional LC stages may be included in the filtering section 232 to enhance the response of the stop band filter 230. In addition, one or more of the capacitors within the filtering section 232 may include a varactor coupled in series and/or parallel to provide tunability to the stop band filter. Further, the inductors and capacitors of the filtering section 232 are sized in value and geometry to be realizable integrated circuit passive components.

The preceding discussion has presented an unconditionally stable filter that includes a filtering section and a negative resistance module. By designing the filtering section to include realizable integrated circuit passive components and utilizing the negative resistance module to compensate for losses induces by the realizable integrated circuit passive components an unconditionally stable on-chip filter is achieved. While various embodiments of the unconditionally stable on-chip are contemplated to be fully implemented on an integrated circuit, the concepts of the present invention may be used to construct an unconditionally stable filter using discrete components, or a combination of discrete components and integrated circuit components. Further, the concepts of the present invention are applicable to any type of filter including, but not limited to parallel coupled lined filters and inter-digital filters. As one of average skill in the art will appreciate, other embodiments may be derived from the teaching of the present invention, without deviating from the scope of the claims.

What is claimed is:

1. An unconditionally stable filter comprises:
    filtering section operably coupled to filter a signal, wherein the filtering section includes realizable integrated circuit passive components; and
    at least one negative resistance module operably coupled to compensate for integrated circuit losses of the filtering section, wherein a negative resistance module of the at least one negative resistance module further comprises a cross coupled transistor pair coupled in parallel with a component of the filtering section that provides at least a portion of the integrated circuit losses.

2. The unconditionally stable filter of claim 1, wherein the negative resistance module further comprises:
    current source operably coupled to the crossed coupled transistor pair to provide a fixed current for the cross coupled transistor pair or a variable current for the crossed coupled transistor pair.

3. The unconditionally stable filter of claim 1, wherein the filtering section further comprises:

first parallel inductor-capacitor circuit;

series inductor-capacitor circuit; and second parallel inductor-capacitor circuit, wherein the first parallel inductor-capacitor circuit, the series inductor-capacitor circuit, and the second parallel inductor-capacitor circuit are interoperably coupled to provide a bandpass filter, wherein a first negative resistance module of the at least one negative resistance module is coupled in parallel with the first parallel inductor-capacitor circuit and a second negative resistance module of the at least one negative resistance module is coupled in parallel with the second parallel inductor-capacitor circuit, and wherein the unconditionally stable filter is implemented on an integrated circuit.

4. The unconditionally stable filter of claim 3, wherein the filtering section further comprises:

third parallel inductor-capacitor circuit;

second series inductor-capacitor circuit; and fourth parallel inductor-capacitor circuit, wherein the first parallel inductor-capacitor circuit, the series inductor-capacitor circuit, the second parallel inductor-capacitor circuit, the third parallel inductor-capacitor circuit, the second series inductor-capacitor circuit, and the fourth parallel inductor-capacitor circuit are interoperably coupled to provide a differential bandpass filter, wherein a third negative resistance module of the at least one negative resistance module is coupled in parallel with the third parallel inductor-capacitor circuit and a fourth negative resistance module of the at least one negative resistance module is coupled in parallel with the fourth parallel inductor-capacitor circuit.

5. The unconditionally stable filter of claim 3, wherein the filtering section further comprises:

at least one varactor operably coupled to at least one of the first parallel inductor-capacitor circuit, the series inductor-capacitor circuit, and the second parallel inductor-capacitor circuit such that frequency response of the unconditionally stable on-chip filter is adjustable.

6. The unconditionally stable filter of claim 1, wherein the filtering section further comprises:

at least one inductor-capacitor stage configured as a low pass filter, wherein a first negative resistance module of the at least one negative resistance module is coupled in parallel with the inductor of the at least one inductor-capacitor stage, and wherein the unconditionally stable filter is implemented on an integrated circuit.

7. The unconditionally stable filter of claim 6, wherein the filtering section further comprises:

a second inductor-capacitor stage operably coupled to the at least one inductor-capacitor stage to provide a differential low pass filter, wherein a second negative resistance module of the at least one negative resistance module is coupled in parallel with the inductor of the second inductor-capacitor stage.

8. The unconditionally stable filter of claim 6, wherein the filtering section further comprises:

at least one varactor operably coupled to the capacitor of the at least one inductor-capacitor stage such that frequency response of the unconditionally stable on-chip filter is adjustable.

9. The unconditionally stable filter of claim 6, wherein the filtering section further comprises:

at least one varactor operably coupled to the capacitor of the at least one inductor-capacitor stage such that frequency response of the unconditionally stable on-chip filter is adjustable.

10. The unconditionally stable filter of claim 1, wherein the filtering section further comprises:

at least one inductor-capacitor stage configured as a high pass filter, wherein a first negative resistance module of the at least one negative resistance module is coupled in parallel with the inductor of the at least one inductor-capacitor stage, and wherein the unconditionally stable filter is implemented on an integrated circuit.

11. The unconditionally stable filter of claim 10, wherein the filtering section further comprises:

a second inductor-capacitor stage operably coupled to the at least one inductor-capacitor stage to provide a differential high pass filter, wherein a second negative resistance module of the at least one negative resistance module is coupled in parallel with the inductor of the second inductor-capacitor stage.

12. The unconditionally stable filter of claim 1, wherein the filtering section further comprises:

first series inductor-capacitor circuit;

parallel inductor-capacitor circuit; and second series inductor-capacitor circuit, wherein the first series inductor-capacitor circuit, the parallel inductor-capacitor circuit, and the second series inductor-capacitor circuit are interoperably coupled to provide a stop band filter, wherein a first negative resistance module of the at least one negative resistance module is coupled in parallel with the inductor of the parallel inductor-capacitor circuit, and wherein the unconditionally stable filter is implemented on an integrated circuit.

13. The unconditionally stable filter of claim 12, wherein the filtering section further comprises:

third series inductor-capacitor circuit;

second parallel inductor-capacitor circuit; and fourth series inductor-capacitor circuit, wherein the first series inductor-capacitor circuit, the parallel inductor-capacitor circuit, the second series inductor-capacitor circuit, the third series inductor-capacitor circuit, the second parallel inductor-capacitor circuit, and the fourth series inductor-capacitor circuit are interoperably coupled to provide a differential stop band filter, wherein a second negative resistance module of the at least one negative resistance module is coupled in parallel with the inductor of the second parallel inductor-capacitor circuit.

14. The unconditionally stable filter of claim 12, wherein the filtering section further comprises:

at least one varactor operably coupled to at least one of the first series inductor-capacitor circuit, the parallel inductor-capacitor circuit, and the second series inductor-capacitor circuit such that frequency response of the unconditionally stable on-chip filter is adjustable.

15. An integrated circuit (IC) radio receiver comprises:

a low noise amplifier;

a bandpass filter that includes:

a bandpass filtering section operably coupled to filter a signal, wherein the bandpass filtering section includes realizable integrated circuit passive components; and at least one negative resistance module operably coupled to compensate for integrated circuit losses of the bandpass filtering section, wherein a negative resistance module of the at least one negative resistance module further comprises a cross coupled transistor pair coupled in parallel with a component of the filtering section that provides at least a portion of the integrated circuit losses; and down-conversion module, wherein the low noise amplifier, the bandpass filter, and the down-conversion module are operably coupled to convert a received radio frequency (RF) signal into a low intermediate frequency (IF) signal.

16. The IC radio receiver of claim 15, wherein the negative resistance module further comprises:

current source operably coupled to the crossed coupled transistor pair to provide a fixed current for the cross coupled transistor pair or a variable current for the crossed coupled transistor pair.

17. The IC radio receiver of claim 15, wherein the bandpass filtering section further comprises:

first parallel inductor-capacitor circuit;

series inductor-capacitor circuit; and second parallel inductor-capacitor circuit, wherein the first parallel inductor-capacitor circuit, the series inductor-capacitor circuit, and the second parallel inductor-capacitor circuit are interoperably coupled to provide the bandpass filter, wherein a first negative resistance module of the at least one negative resistance module is coupled in parallel with the first parallel inductor-capacitor circuit and a second negative resistance module of the at least one negative resistance module is coupled in parallel with the second parallel inductor-capacitor circuit.

18. The IC radio receiver of claim 17, wherein the bandpass filtering section further comprises:

third parallel inductor-capacitor circuit;

second series inductor-capacitor circuit; and fourth parallel inductor-capacitor circuit, wherein the first parallel inductor-capacitor circuit, the series inductor-capacitor circuit, the second parallel inductor-capacitor circuit, the third parallel inductor-capacitor circuit, the second series inductor-capacitor circuit, and the fourth parallel inductor-capacitor circuit are interoperably coupled to provide a differential bandpass filter, wherein a third negative resistance module of the at least one negative resistance module is coupled in parallel with the third parallel inductor-capacitor circuit and a fourth negative resistance module of the at least one negative resistance module is coupled in parallel with the fourth parallel inductor-capacitor circuit.

19. The IC radio receiver of claim 17, wherein the bandpass filtering section further comprises:

at least one varactor operably coupled to at least one of the first parallel inductor-capacitor circuit, the series inductor-capacitor circuit, and the second parallel inductor-capacitor circuit such that frequency response of the bandpass filter is adjustable.

20. The IC radio receiver of claim 15 further comprises:

low pass filter operably coupled to filter the low IF signal, wherein the low pass filter includes:

a low pass filtering section operably coupled to filter the low IF signal, wherein the low pass filtering section includes realizable integrated circuit passive components; and at least one negative resistance module operably coupled to compensate for integrated circuit losses of the bandpass filtering section.

21. The IC radio receiver of claim 20, wherein the low pass filtering section further comprises:

at least one inductor-capacitor stage configured as the low pass filter, wherein a first negative resistance module of the at least one negative resistance module is coupled in parallel with the inductor of the at least one inductor-capacitor stage.

22. The IC radio receiver of claim 21, wherein the low pass filtering section further comprises:

a second inductor-capacitor stage operably coupled to the at least one inductor-capacitor stage to provide a differential low pass filter, wherein a second negative resistance module of the at least one negative resistance module is coupled in parallel with the inductor of the second inductor-capacitor stage.

23. The IC radio receiver of claim 21, wherein the low pass filtering section further comprises:

at least one varactor operably coupled to the capacitor of the at least one inductor-capacitor stage such that frequency response of the low pass filter is adjustable.

24. The IC radio receiver of claim 15 further comprises:

second bandpass filter operably coupled to filter the low IF signal, wherein the second bandpass filter includes:

second bandpass filtering section operably coupled to filter the low IF signal, wherein the second bandpass filtering section includes realizable integrated circuit passive components; and at least one negative resistance module operably coupled to compensate for integrated circuit losses of the bandpass filtering section.

25. The IC radio receiver of claim 24, wherein the second bandpass filtering section further comprises:

first parallel inductor-capacitor circuit;

series inductor-capacitor circuit; and second parallel inductor-capacitor circuit, wherein the first parallel inductor-capacitor circuit, the series inductor-capacitor circuit, and the second parallel inductor-capacitor circuit are interoperably coupled to provide the second bandpass filter, wherein a first negative resistance module of the at least one negative resistance module is coupled in parallel with the first parallel inductor-capacitor circuit and a second negative resistance module of the at least one negative resistance module is coupled in parallel with the second parallel inductor-capacitor circuit.

26. The IC radio receiver of claim 25, wherein the second bandpass filtering section further comprises:

third parallel inductor-capacitor circuit;

second series inductor-capacitor circuit; and fourth parallel inductor-capacitor circuit, wherein the first parallel inductor-capacitor circuit, the series inductor-capacitor circuit, the second parallel inductor-capacitor circuit, the third parallel inductor-capacitor circuit, the second series inductor-capacitor circuit, and the fourth parallel inductor-capacitor circuit are interoperably coupled to provide a differential bandpass filter, wherein a third negative resistance module of the at least one negative resistance module is coupled in parallel with the third parallel inductor-capacitor circuit and a fourth negative resistance module of the at least one negative resistance module is coupled in parallel with the fourth parallel inductor-capacitor circuit.

27. The IC radio receiver of claim 25, wherein the second bandpass filtering section further comprises:

at least one varactor operably coupled to at least one of the first parallel inductor-capacitor circuit, the series inductor-capacitor circuit, and the second parallel inductor-capacitor circuit such that frequency response of the second bandpass filter is adjustable.

28. An integrated circuit (IC) radio transmitter comprises:
power amplifier;
a bandpass filter that includes:
  a bandpass filtering section operably coupled to filter a signal, wherein the bandpass filtering section includes realizable integrated circuit passive components; and
  at least one negative resistance module operably coupled to compensate for integrated circuit losses of the bandpass filtering section, wherein a negative resistance module of the at least one negative resistance module further comprises a cross coupled transistor pair coupled in parallel with a component of the filtering section that provides at least a portion of the integrated circuit losses; and
up-conversion module, wherein the power amplifier, the bandpass filter, and the up-conversion module are operably coupled to convert a received low intermediate f0requency (IF) signal into a radio frequency (RF) signal.

29. The IC radio transmitter of claim 28, wherein the negative resistance module further comprises:
current source operably coupled to the crossed coupled transistor pair to provide a fixed current for the cross coupled transistor pair or a variable current for the crossed coupled transistor pair.

30. The IC radio transmitter of claim 28, wherein the bandpass filtering section further comprises:
first parallel inductor-capacitor circuit;
series inductor-capacitor circuit; and
second parallel inductor-capacitor circuit, wherein the first parallel inductor-capacitor circuit, the series inductor-capacitor circuit, and the second parallel inductor-capacitor circuit are interoperably coupled to provide the bandpass filter, wherein a first negative resistance module of the at least one negative resistance module is coupled in parallel with the first parallel inductor-capacitor circuit and a second negative resistance module of the at least one negative resistance module is coupled in parallel with the second parallel inductor-capacitor circuit.

31. The IC radio transmitter of claim 30, wherein the bandpass filtering section further comprises:
third parallel inductor-capacitor circuit;
second series inductor-capacitor circuit; and
fourth parallel inductor-capacitor circuit, wherein the first parallel inductor-capacitor circuit, the series inductor-capacitor circuit, the second parallel inductor-capacitor circuit, the third parallel inductor-capacitor circuit, the second series inductor-capacitor circuit, and the fourth parallel inductor-capacitor circuit are interoperably coupled to provide a differential bandpass filter, wherein a third negative resistance module of the at least one negative resistance module is coupled in parallel with the third parallel inductor-capacitor circuit and a fourth negative resistance module of the at least one negative resistance module is coupled in parallel with the fourth parallel inductor-capacitor circuit.

32. The IC radio transmitter of claim 30, wherein the bandpass filtering section further comprises:
at least one varactor operably coupled to at least one of the first parallel inductor-capacitor circuit, the series inductor-capacitor circuit, and the second parallel inductor-capacitor circuit such that frequency response of the bandpass filter is adjustable.

33. The IC radio transmitter of claim 28 further comprises:
low pass filter operably coupled to filter the low IF signal, wherein the low pass filter includes:
  a low pass filtering section operably coupled to filter the low IF signal, wherein the low pass filtering section includes realizable integrated circuit passive components; and
  at least one negative resistance module operably coupled to compensate for integrated circuit losses of the bandpass filtering section.

34. The IC radio transmitter of claim 33, wherein the low pass filtering section further comprises:
at least one inductor-capacitor stage configured as the low pass filter, wherein a first negative resistance module of the at least one negative resistance module is coupled in parallel with the inductor of the at least one inductor-capacitor stage.

35. The IC radio transmitter of claim 34, wherein the low pass filtering section further comprises:
a second inductor-capacitor stage operably coupled to the at least one inductor-capacitor stage to provide a differential low pass filter, wherein a second negative resistance module of the at least one negative resistance module is coupled in parallel with the inductor of the second inductor-capacitor stage.

36. The IC radio transmitter of claim 34, wherein the low pass filtering section further comprises:
at least one varactor operably coupled to the capacitor of the at least one inductor-capacitor stage such that frequency response of the low pass filter is adjustable.

37. The IC radio transmitter of claim 28 further comprises:
second bandpass filter operably coupled to filter the low IF signal, wherein the second bandpass filter includes:
  second bandpass filtering section operably coupled to filter the low IF signal, wherein the second bandpass filtering section includes realizable integrated circuit passive components; and
  at least one negative resistance module operably coupled to compensate for integrated circuit losses of the bandpass filtering section.

38. The IC radio transmitter of claim 37, wherein the second bandpass filtering section further comprises:
first parallel inductor-capacitor circuit;
series inductor-capacitor circuit; and
second parallel inductor-capacitor circuit, wherein the first parallel inductor-capacitor circuit, the series inductor-capacitor circuit, and the second parallel inductor-capacitor circuit are interoperably coupled to provide the second bandpass filter, wherein a first negative resistance module of the at least one negative resistance module is coupled in parallel with the first parallel inductor-capacitor circuit and a second negative resistance module of the at least one negative resistance module is coupled in parallel with the second parallel inductor-capacitor circuit.

39. The IC radio transmitter of claim 38, wherein the second bandpass filtering section further comprises:
third parallel inductor-capacitor circuit;
second series inductor-capacitor circuit; and
fourth parallel inductor-capacitor circuit, wherein the first parallel inductor-capacitor circuit, the series inductor-capacitor circuit, the second parallel inductor-capacitor circuit, the third parallel inductor-capacitor circuit, the second series inductor-capacitor circuit, and the fourth parallel inductor-capacitor circuit are interoperably coupled to provide a differential bandpass filter, wherein a third negative resistance module of the at least one negative resistance module is coupled in parallel with the third parallel inductor-capacitor circuit and a fourth negative resistance module of the at least one negative resistance module is coupled in parallel with the fourth parallel inductor-capacitor circuit.

40. The IC radio transmitter of claim 38, wherein the second bandpass filtering section further comprises:

at least one varactor operably coupled to at least one of the first parallel inductor-capacitor circuit, the series inductor-capacitor circuit, and the second parallel inductor-capacitor circuit such that frequency response of the second bandpass filter is adjustable.

* * * * *